(12) United States Patent
Chandra et al.

(10) Patent No.: US 10,698,855 B1
(45) Date of Patent: *Jun. 30, 2020

(54) DIFFERENTIAL PAIR CONTACT RESISTANCE ASYMMETRY COMPENSATION SYSTEM

(71) Applicant: Dell Products L. P., Round Rock, TX (US)

(72) Inventors: Umesh Chandra, Santa Cruz, CA (US); Bhyrav M. Mutnury, Austin, TX (US); Hamza S. Rahman, Campbell, CA (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/262,407

(22) Filed: Jan. 30, 2019

(51) Int. Cl.
*G06F 13/40* (2006.01)
*H05K 1/02* (2006.01)
*H03H 11/28* (2006.01)
*H01R 13/6473* (2011.01)

(52) U.S. Cl.
CPC .......... *G06F 13/4086* (2013.01); *H03H 11/28* (2013.01); *H05K 1/0243* (2013.01); *H05K 1/0245* (2013.01); *H05K 2201/10212* (2013.01)

(58) Field of Classification Search
None
See application file for complete search history.

*Primary Examiner* — Idriss N Alrobaye
*Assistant Examiner* — Dayton Lewis-Taylor
(74) *Attorney, Agent, or Firm* — Haynes and Boone, LLP

(57) ABSTRACT

A differential pair contact resistance asymmetry compensation system includes a differential trace pair that is provided on a board, a transmitter device that is coupled to the differential trace pair via a transmitter device connector interface, and a receiver device that is coupled to the differential trace pair via a receiver device connector interface. The receiver device receives, from the transmitter device via the differential trace pair, a contact resistance compensation data stream. The receiver device adjusts an impedance provided by the receiver device to compensate for a contact resistance asymmetry in at least the receiver device connector interface, and sets the impedance provided by the receiver device.

20 Claims, 13 Drawing Sheets

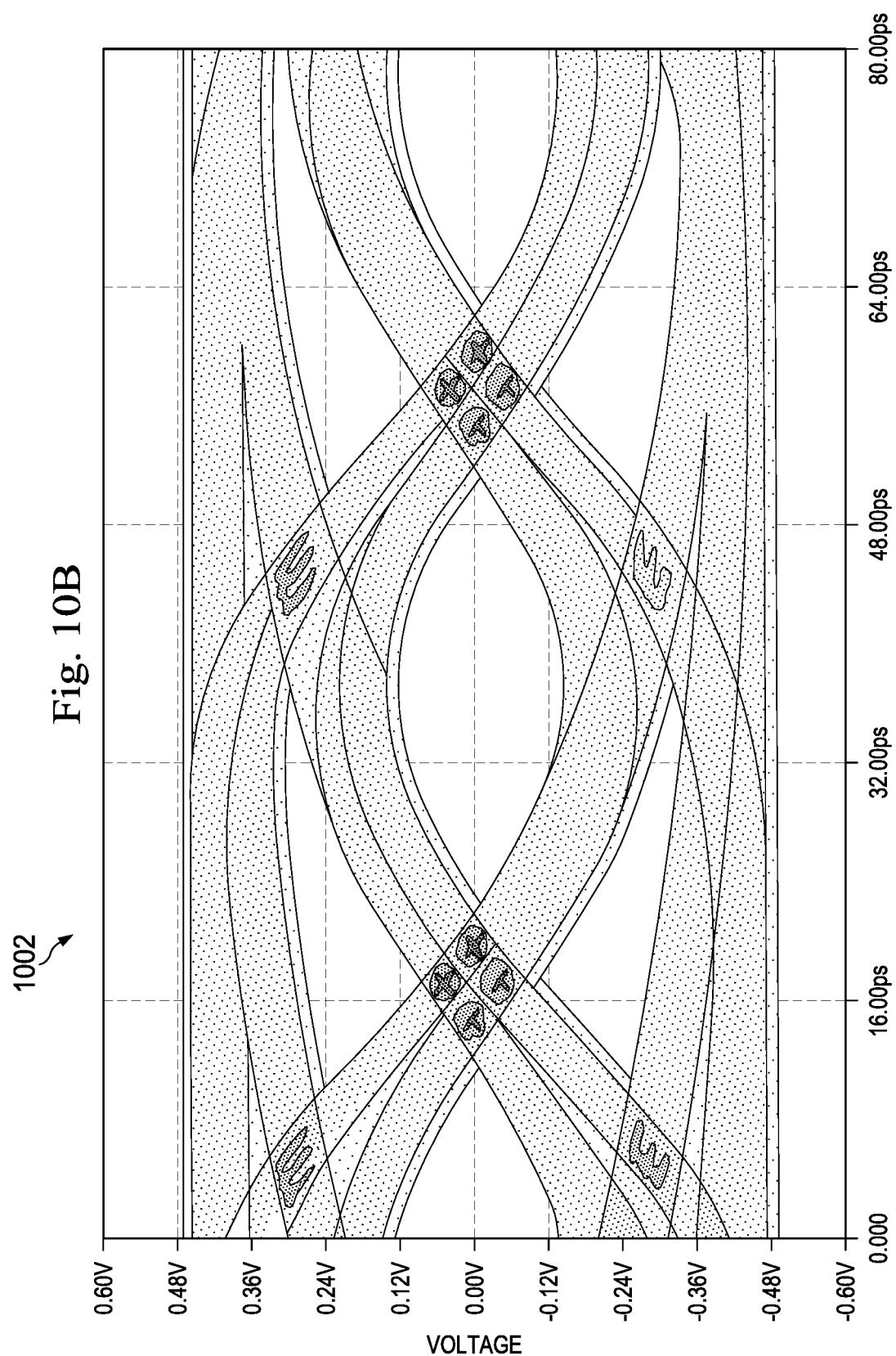

DIFFERENTIAL PAIR CONTACT RESISTANCE ASYMMETRY COMPENSATION SYSTEM

BACKGROUND

The present disclosure relates generally to information handling systems, and more particularly to compensating for contact resistance asymmetry present in the connector interfaces to differential pairs in an information handling system.

As the value and use of information continues to increase, individuals and businesses seek additional ways to process and store information, One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems often utilize differential signaling techniques to transmit signals between devices. Differential signaling operates by sending the same electrical signal as a differential pair of complementary signals, each in its own conductor (e.g., via differential trace pairs routed on a circuit board in the information handling system.) However, as the speed at which such differential signals are transmitted continues to increase, the performance of those the signals continues to degrade, and subtle parasitic effects that were previously negligible have begun to contribute significantly to that signal performance degradation. For example, Surface Mount Technology (SMT) connectors and their components are often mounted to connector pads on a circuit board that provide access to differential pair traces included in that circuit board, and those SMT connector/connector pad mountings are associated with a contact resistance. It has been found that, as the speeds at which the differential signals are transmitted via the differential pairs increase, asymmetric variations in the contact resistance in the SMT connectors/connector pads that provide access to a differential pair can introduce significant degradations in the signal transmission capabilities for that differential pair. Furthermore, signal integrity modeling may not capture the signal degradation resulting from such asymmetric variations in contact resistance, and that signal degradation will become more prominent as differential signaling speeds continue to increase. Conventional solutions to contact resistance asymmetry in differential pairs is limited to remounting the connectors to the connector pads, or screening circuit boards to ensure proper contact between connectors and connector pads, both of which increase time and cost associated with providing circuit boards.

Accordingly, it would be desirable to provide a differential pair contact resistance asymmetry compensation system.

SUMMARY

According to one embodiment, an Information Handling System (IHS) includes: a processing system; and a memory system that is coupled to the processing system and that includes instructions that, when executed by the processing system, cause the processing system to provide a contact resistance asymmetry compensation engine that is configured to: receive, from a transmitter device via a connector interface and a differential pair, a contact resistance compensation data stream; adjust an impedance provided by receiver circuitry used to receive the contact resistance compensation data stream in order to compensate for a contact resistance asymmetry in at least the connector interface; and set the impedance provided by the receiver circuitry.

BRIEF DESCRIPTION OF THE DRAWINGS

FIG. 10B is an eye diagram illustrating an embodiment of the results of the compensation of the contact resistance asymmetry for the differential trace pair illustrated in FIG. 10A.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
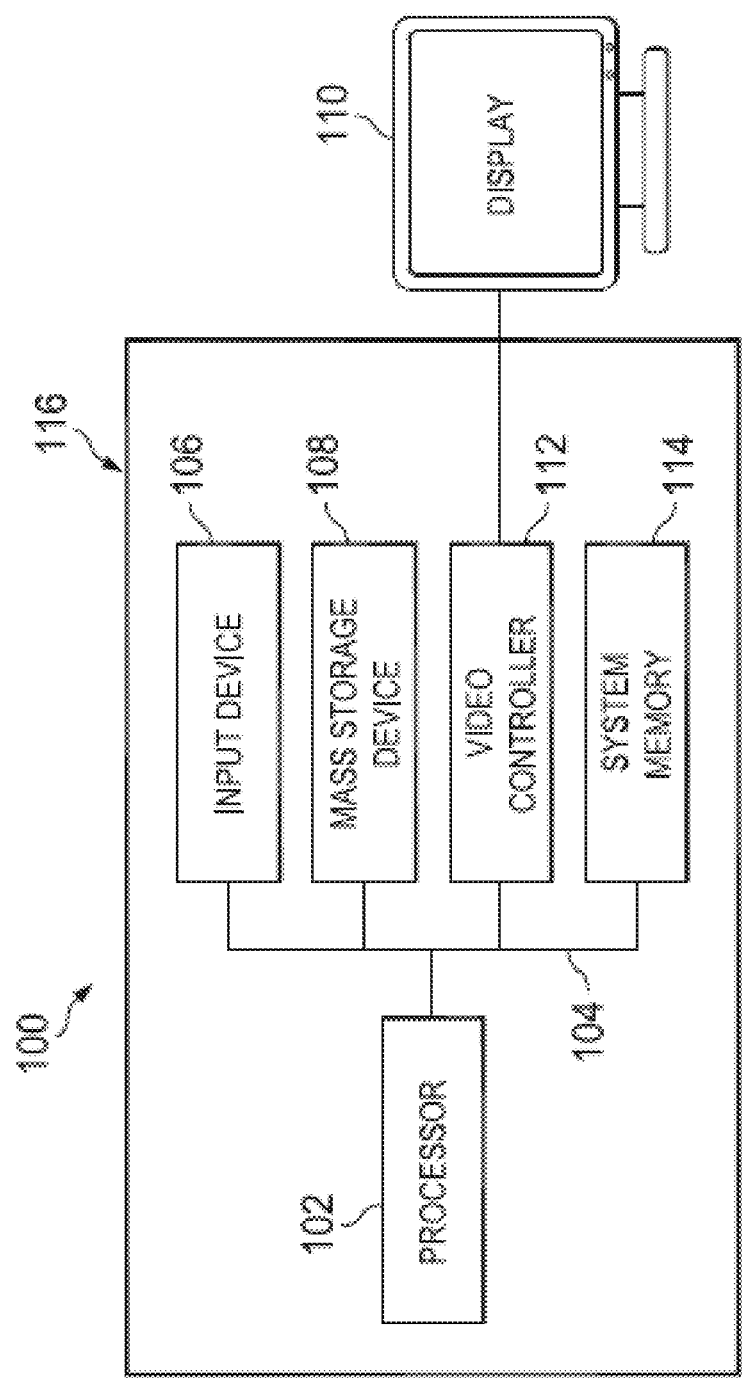
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
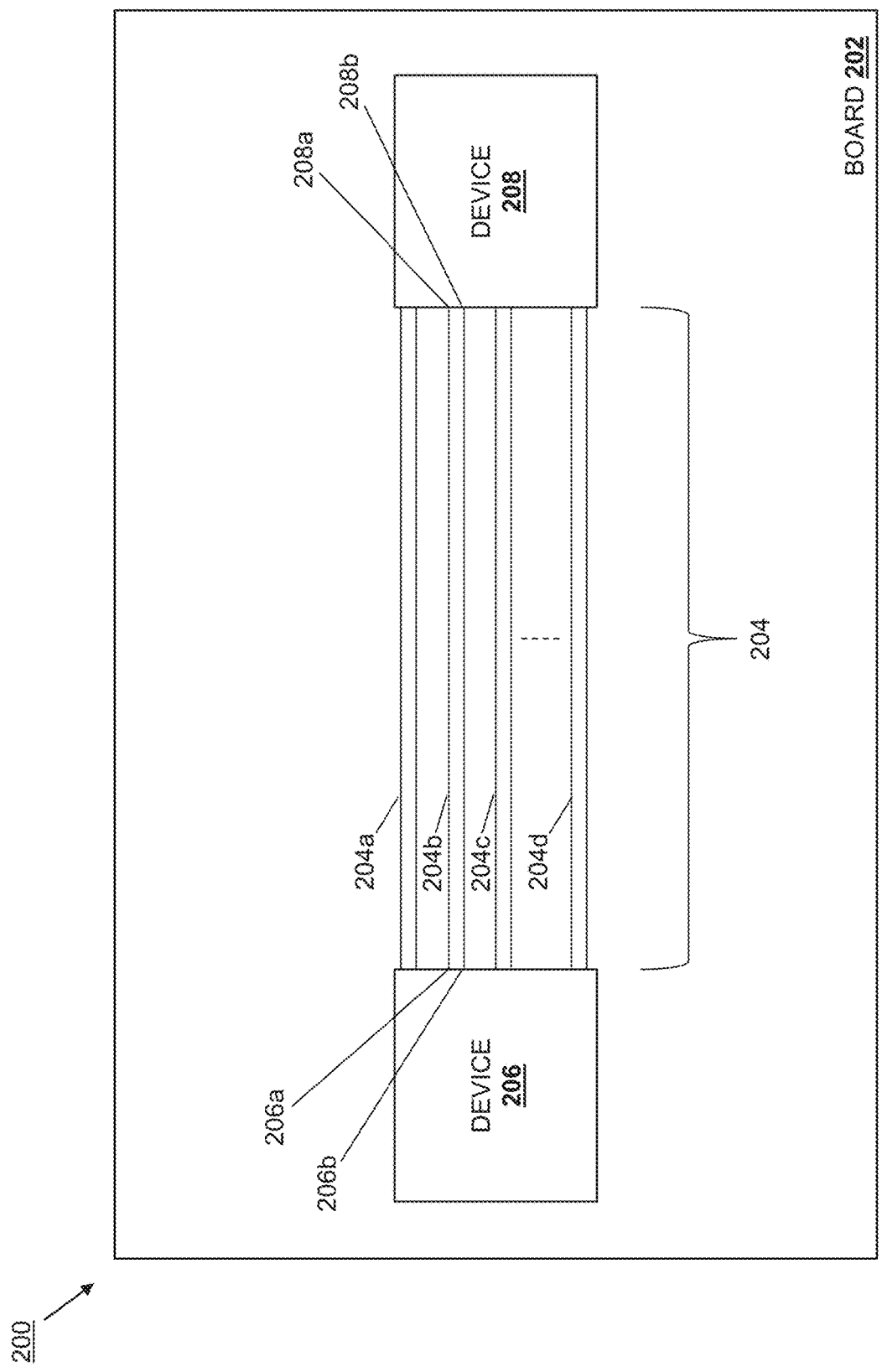
FIG. 2 is a schematic view illustrating an embodiment of a differential pair contact resistance asymmetry compensation system.

Referring now to FIG. 2, an embodiment of a differential pair contact resistance asymmetry compensation system 200 is illustrated. In an embodiment, the differential pair contact resistance asymmetry compensation system 200 may be provided in the IHS 100 discussed above with reference to FIG. 1, and/or may include some or all of the components of the IHS 100. In the illustrated embodiment, the differential pair contact resistance asymmetry compensation system 200 includes a board 202 that may be provided by, for example, a motherboard, a card, and/or any other circuit boards that would be apparent to one of skill in the art in possession of the present disclosure. In the illustrated embodiment, the board 202 provides a differential trace pair group 204 that includes plurality of differential trace pairs 204a, 204b, 204c, and up to 204d that are routed on and/or in the board 202 between a device 206 and a device 206. As would be understood by one of skill in the art in possession of the present disclosure, each of the differential trace pairs 204a-204d may be provided by a pair of traces (e.g., a positive differential pair trace and a negative differential pair trace) that are routed through the board 202 and that are each configured to carry the same electrical signal such that the different trace pair transmits that electrical signal as a differential pair of complementary signals. Furthermore, in a specific example, the differential trace pair group 204 may provide a high speed serial bus/link that one of skill in the art in possession of the present disclosure will recognize typically includes multiple differential trace pairs (e.g., x4, x8, x16, x32, etc.) that provide a plurality of "lanes" that each include one differential trace pair dedicated to transmitter communications, and one differential trace pair dedicated to receiver communications However, while the illustrated embodiment includes a differential trace pair group with differential trace pairs, one of skill in the art in possession of the present disclosure will recognize that differential pairs (e.g., wired differential pairs and/or other differential pair components) may be configured in a variety of manners will benefit from the teachings of the present disclosure as thus fall within its scope as well.

In an embodiment, each of the devices 206 and/or 208 may be provided by one or more components in the IHS 100 discussed above with reference to FIG. 1. Furthermore, one of skill in the art in possession of the present disclosure will recognize that each of the devices 206 and 208 may operate as the receiver device and/or transmitter device discussed below. In a specific example, the device 206 may be a Central Processing Unit (CPU), and the device 208 may be a storage controller, another CPU, a network controller, an adapter card, a hard drive, and/or a variety of other computing components that would be apparent to one of skill in the art in possession of the present disclosure. However, one of skill in the art in possession of the present disclosure will recognize that any devices coupled to a differential pair will fall within the scope of the present disclosure as well. Each of the devices 206 and 208 may be connected to each differential pair 204a-d by respective connector interfaces. For example, FIG. 2 illustrates the device 206 connected to the differential pair 204b by connector interfaces 206a and 206b, and the device 208 connected to the differential pair 204b by connector interfaces 208a and 208b. While not illustrated, any of the connector interfaces that connect devices to differential pairs may be provided by connectors (e.g., Surface Mount Technology (SMT) connectors and their components) mounted to connector pads on the board 202 that provide access to the differential pairs 204a-d and, as discussed above, each of those connector interfaces provided by the connector/connector pad mountings may be associated with a respective contact resistance.

While a specific differential pair contact resistance asymmetry compensation system 200 has been illustrated and described, one of skill in the art will recognize that differential pair contact resistance asymmetry compensation systems may include a variety of components and/or a variety of component configurations that will fall within the scope of the present disclosure as well. For example, one of skill in the art in possession of the present disclosure will recognize that the routing of the differential trace pairs 204a-d in the differential trace pair group 204 illustrated in FIG. 2 has been greatly simplified, and differential trace pairs in multiple different differential trace pair groups may (and typically will) be routed using much more complicated routing paths, and/or on multiple different levels of the board 202, while still benefitting from the teachings of the present disclosure.

Figure 3:
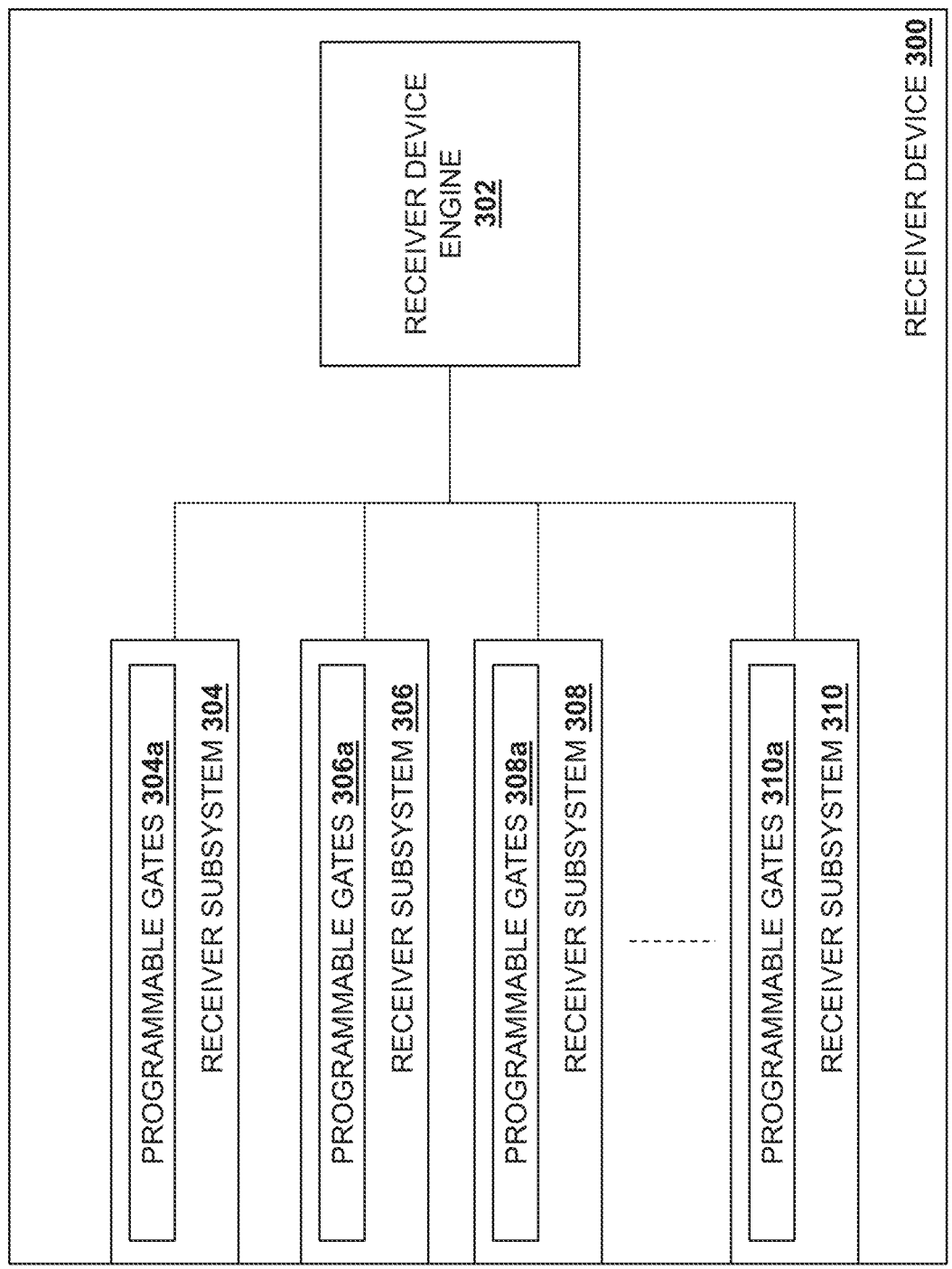
FIG. 3 is a schematic view illustrating an embodiment of a receiver device that may be provided in the differential pair contact resistance asymmetry compensation system of FIG. 2.

Referring now to FIG. 3, an embodiment of a receiver device 300 is illustrated that may be either of the devices 206 and 208 discussed above with reference to FIG. 2. As such, the receiver device 300 may be a component in the IHS 100 discussed above with reference to FIG. 1. The receiver device 300 may include a processing system (not illustrated, but which may include the processor 102 discussed above with reference to FIG. 1, or a component having similar functionality) and a memory system (not illustrated, but which may include the memory 114 discussed above with reference to FIG. 1, or a component having similar functionality) that includes instructions that, when executed by the processing system, cause the processing system to provide a receiver device engine 302 that is configured to perform the functionality of the receiver device engines and receiver devices discussed below. The receiver device 300 also includes a plurality of receiver subsystems 304, 306, 308, and up to 310, each of which may be coupled to the receiver device engine 302 (e.g., via a connection between each receiver subsystem 304-310 and the processing system that provides the receiver device engine 302), and each of which may be configured to couple the receiver device engine 302 to a respective differential pair (e.g., the differential trace pairs 204*a*-*d* discussed with reference to FIG. 2).

As discussed below, each of the receiver subsystems 304, 306, 308, and 310 may include receiver circuitry that provides one or more impedance element(s) that, in the illustrated embodiment, are provided by a set of programmable gates 304*a*, 306*a*, 308*a*, and 310*a*, respectively. In an embodiment, each programmable gate in the sets of programmable gates 304*a*-310*a* may provide a receiver-device-provided impedance. For example, each programmable gate in the sets of programmable gates 304*a*-310*a* may provide the same receiver-device-provided impedance (e.g., 0.1 ohm, 0.5 ohm, 1 ohm, 2 ohms, or any other impedance that would be apparent to one of skill in the art). In other examples, each programmable gate or a portion of the programmable gates in the sets of programmable gates 304*a*-310*a* may provide a different receiver-device-provided impedance than each other (or another portion) of the programmable gates (e.g., a first programmable gate may provide a 2 ohm receiver-device-provided impedance, while a second programmable gate may provide a 1 ohm receiver-device-provided impedance.)

In a specific example, the receiver subsystems 304, 306, 308, and 310 may each be provided by a physical layer (PHY) chip such as, for example a Serializer/Deserializer (SerDes) PHY chip, although other processor/memory subsystems will fall within the scope of the present disclosure as well. As discussed above, the receiver subsystems 304-310 may each be coupled to respective differential pairs (e.g., the differential pairs 204*a*-*d*) via respective receiver device connector interfaces (e.g., similar to the connector interfaces 206*a*, 206*b*, 208*a*, and/or 208*b* discussed above). As discussed below, the receiver device engine 302 and/or any of the receiver subsystem(s) 304, 306, 308, and 310 may provide the functionality (i.e., by themselves and/or in combination) of the contact resistance asymmetry compensation engine and/or receiver devices discussed below.

Figure 4:
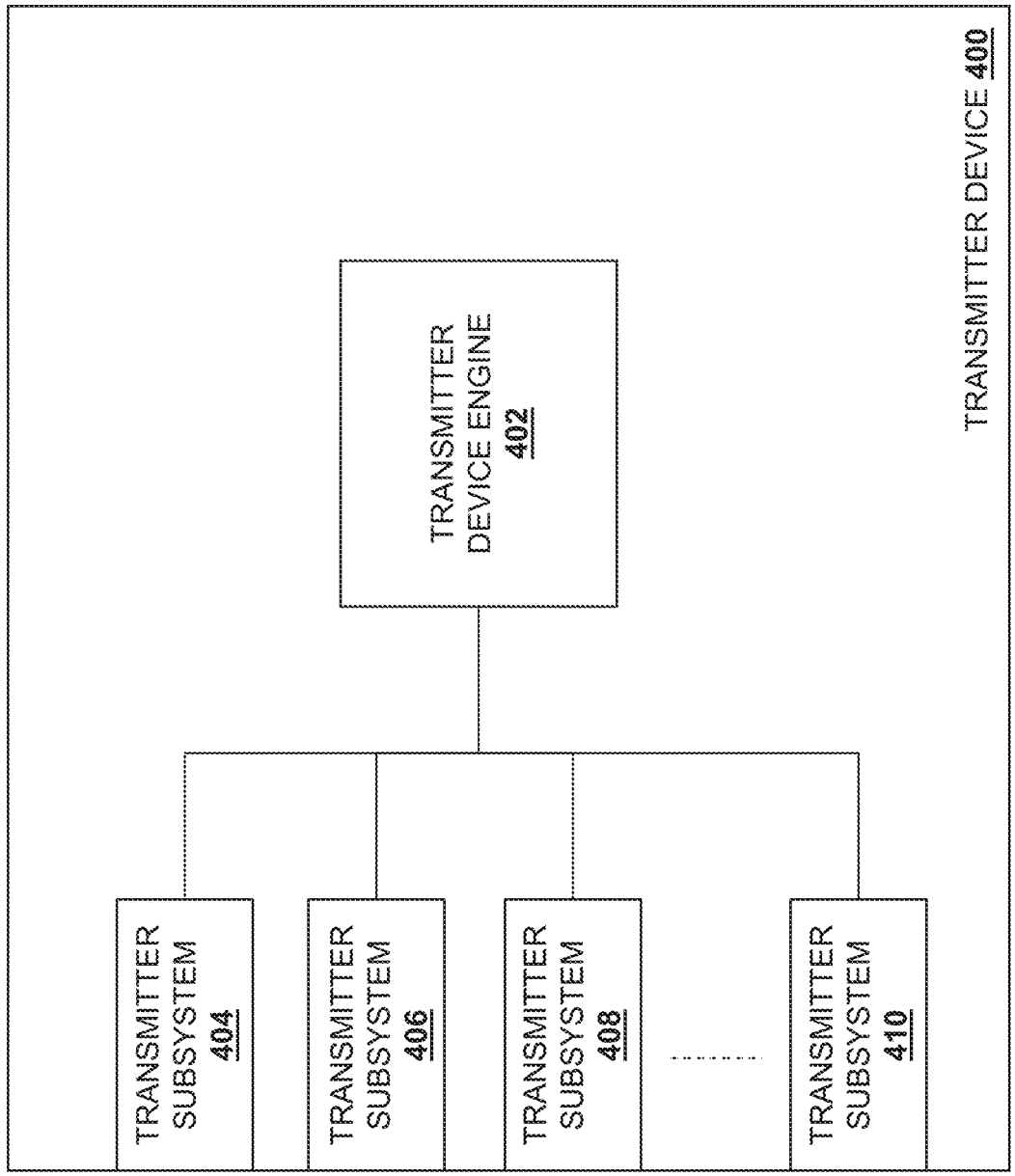
FIG. 4 is a schematic view illustrating an embodiment of a transmitter device that may be provided in the differential pair contact resistance asymmetry compensation system of FIG. 2.

Referring now to FIG. 4, an embodiment of a transmitter device 400 is illustrated that may be either of the devices 206 and 208 discussed above with reference to FIG. 2. As such, the transmitter device 400 may be a component in the IHS 100 discussed above with reference to FIG. 1. The transmitter device 400 may include a processing system (not illustrated, but which may include the processor 102 discussed above with reference to FIG. 1, or a component having similarly functionality) and a memory system (not illustrated, but which may include the memory 114 discussed above with reference to FIG. 1, or a component having similarly functionality) that includes instructions that, when executed by the processing system, cause the processing system to provide a transmitter device engine 402 that is configured to perform the functionality of the transmitter device engines and transmitter devices discussed below. The transmitter device 400 also includes a plurality of transmitter subsystems 404, 406, 408, and up to 410, each of which may be coupled to the transmitter device engine 402 (e.g., via a connection between each transmitter subsystem 404-410 and the processing system that provides the transmitter device engine 402), and each of which may be configured to couple the transmitter device engine 402 to a respective differential pair (e.g., the differential trace pairs 204*a*-*d* discussed with reference to FIG. 2). In a specific example, the transmitter subsystems 404, 406, 408, and 410 may be provided by a physical layer (PHY) chip such as, for example a Serializer/Deserializer (SerDes) PHY chip, although other processor/memory subsystems will fall within the scope of the present disclosure as well. As discussed above, the transmitter subsystems 404-410 may each be coupled to respective differential pairs (e.g., the differential pairs 204*a*-*d*) via respective transmitter device connector interfaces (e.g., similar to the connector interfaces 206*a*, 206*b*, 208*a*, and 208*b* discussed above).

Figure 5:
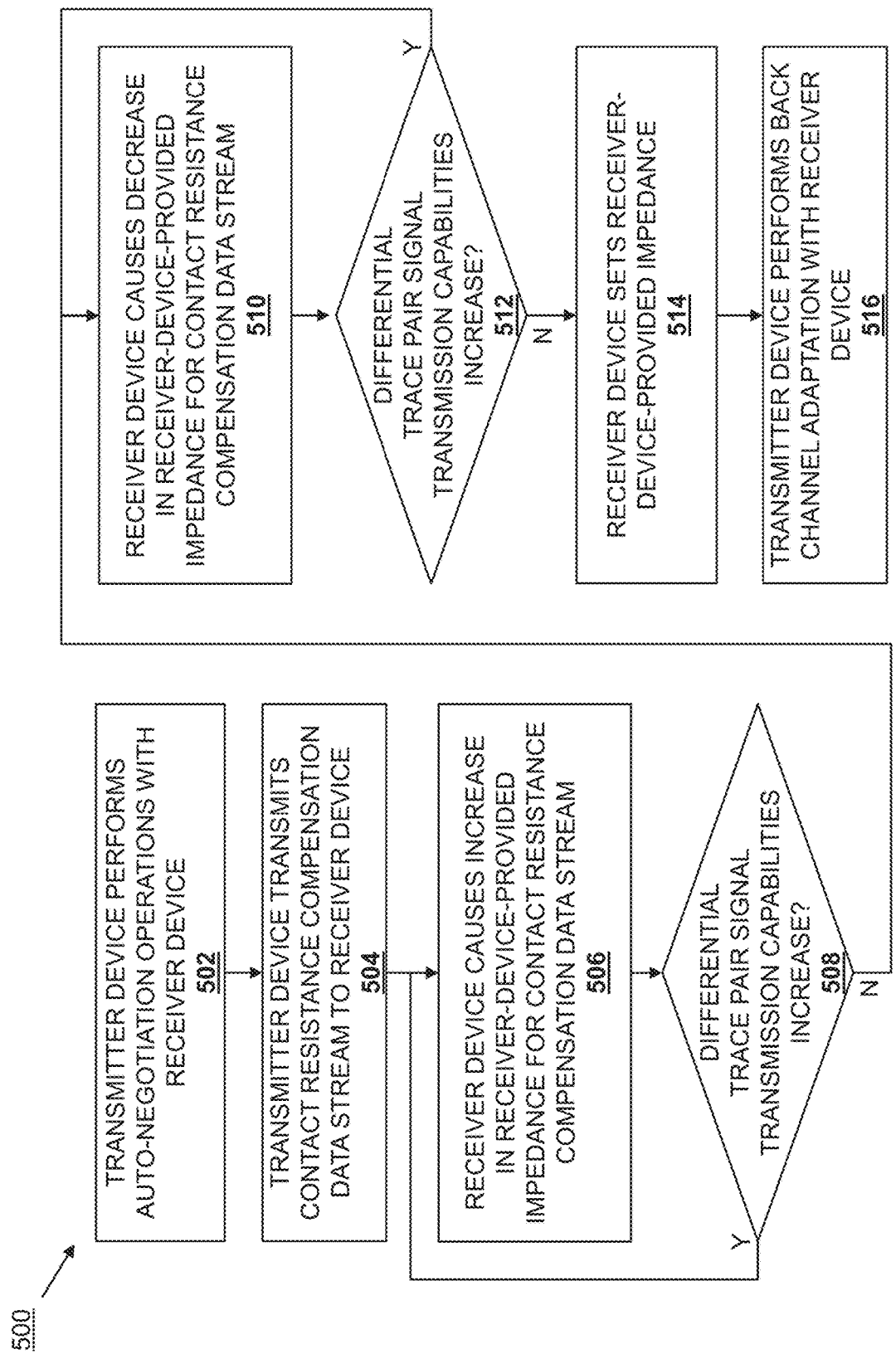
FIG. 5 is a flow chart illustrating an embodiment of a method for compensating for contact resistance asymmetry associated with a differential trace pair.
Figure 6:
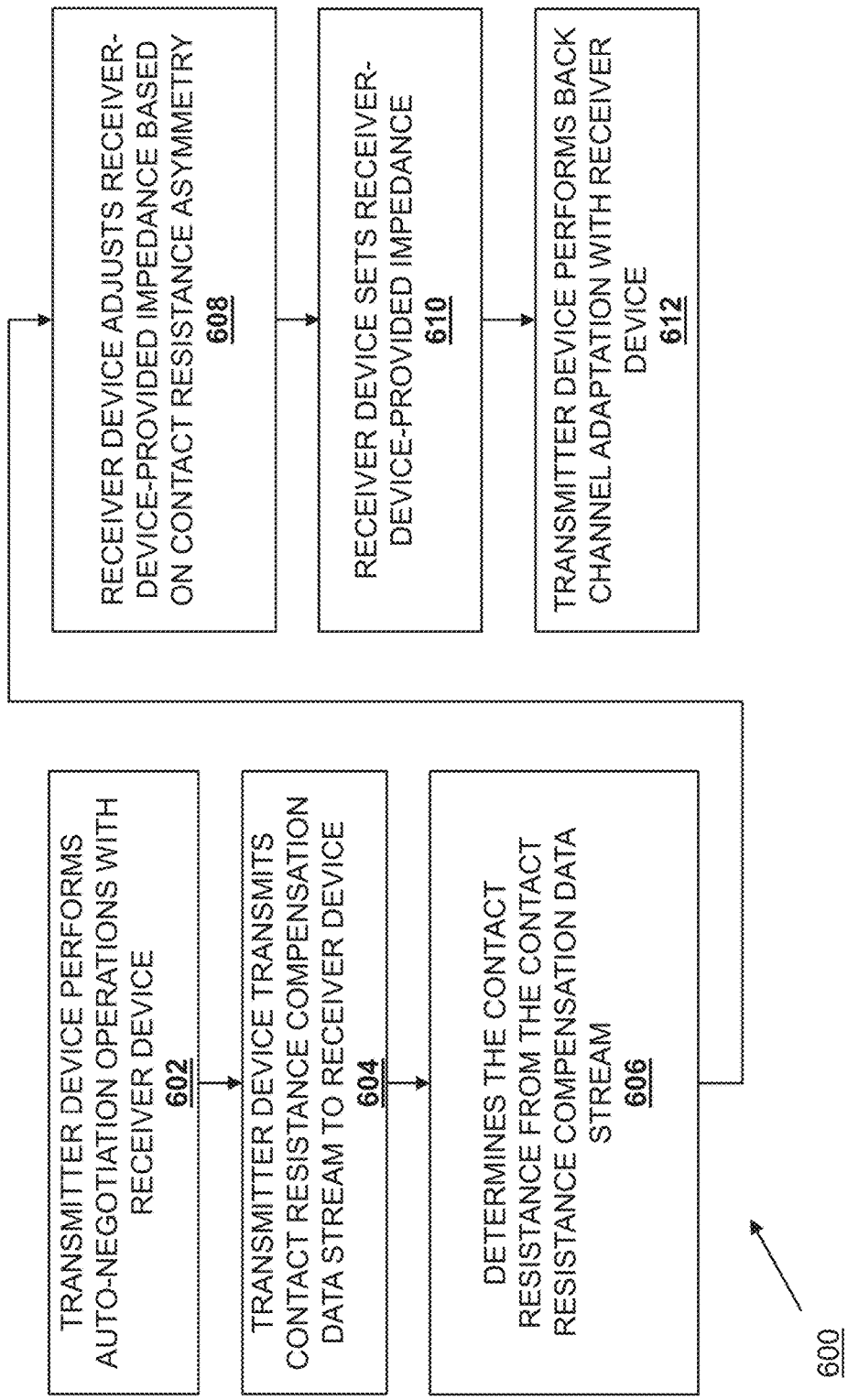
FIG. 6 is a flow chart illustrating an embodiment of a method for compensating for contact resistance asymmetry associated with a differential trace pair.

Referring now to FIG. 5 and FIG. 6, embodiments of methods for compensating for contact resistance asymmetry associated with a differential pair are illustrated. As discussed below, the systems and methods of the present disclosure provide for the compensation of a contact resistance asymmetry that may exist in a connector interface that connects a receiver device to a differential pair and/or a connector interface that connects a transmitter device to the differential pair, which allows for an increase/optimization of the differential pair signal transmission capabilities of the differential pair with respect to that contact resistance asymmetry. For example, the connector interfaces provided by the mounting of connectors (e.g., SMT connectors) to connector pads (e.g., provided on a circuit board and coupled to each differential pair) include contact resistances, and when an asymmetry exists between the contact resistance for a positive portion of the differential pair and the contact resistance for a negative portion of the differential pair, the signal transmission capabilities of that differential pair are decreased. The inventors of the present disclosure have developed a transmitter device that compensates for contact resistance asymmetry associated with a differential pair, and those improvements are described in co-pending U.S. patent application Ser. No. 16/052,879, filed Aug. 2, 2018, the disclosure of which is incorporated by reference herein in its entirety. However, in some situations, changes in impedance at the transmitter device may result in other issues, particularly if contact resistance asymmetry is occurring close to the receiver device (e.g., at the contact interface at the receiver device). For example, compensating for the contact resistance asymmetry at the transmitter device may require an impedance discontinuity to occur on the differential trace to compensate for the contact resistance asymmetry at the receiver device. Making the compensation at the before it is required may cause reflections and noise coupling into the differential signal.

In some embodiments, the receiver device of the present disclosure may operate to adjust an impedance provided by its receiver circuitry (e.g., by increasing or decreasing that impedance) in a manner that compensates for any contact resistance asymmetry in the contact interface(s), which increases the signal transmission capabilities of that differential pair. For example, the receiver device may activate programmable gates to increase an impedance provided by the receiver device and/or deactivate programmable gates to decrease an impedance provided by the receiver device, and then determine whether an eye opening in eye diagram (which is generated at least in part using a data stream transmitted by the differential pair) has been increased in response to the adjustment of the impedance provided by the receiver device. In other embodiments, the receiver device of the present disclosure may determine the actual contact resistance asymmetry in the contact interface(s) for a negative differential pair trace and a positive differential pair trace that provide a differential trace pair, and use the programmable gates to adjust the impedance provided by the receiver device to negate the difference in impedance between the negative differential pair trace and the positive differential pair trace of the differential pair. As such, the signal transmission capabilities of the differential pair may be optimized with respect to the contact resistance asymmetry that exists in at least one of its connector interfaces.

Referring to FIG. 5, a method 500 for compensating for contact resistance asymmetry associated with a differential pair begins at block 502 where a transmitter device performs auto-negotiation operations with a receiver device. In an embodiment, at or prior to block 502, either or both of the devices 206 and 208 (e.g., a receiver device 300 and/or a transmitter device 400) may operate to identify a differential pair group. For example, the receiver device engine 302 and/or the receiver subsystems 304-310 in the receiver device 300, and/or the transmitter device engine 402 and/or the transmitter subsystems 404-410 in the transmitter device 400, may operate to identify serial lanes (e.g., each including a transmitter differential pair and a receiver differential pair) in a bus/link (e.g., a ×16 bus/link that provides 16 differential pairs numbered "0" through "15") that provides a differential pair group. With reference to FIG. 2, at or prior to block 502, the differential trace pairs 204a-d in the differential trace pair group 204 may be identified. Following identification of the differential pair group, at block 502, the transmitter device 400 and the receiver device 300 may perform auto-negotiation operations associated with the differential trace pairs in the differential trace pair group 204 by, for example, sharing capabilities regarding transmission parameters, and selecting the highest performance transmission mode supported by both of the devices 300 and 400 to define common transmission parameters for use in signaling such as, for example, speed, duplex mode, flow control, and/or other transmission parameters that would be apparent to one of skill in the art in possession of the present disclosure. The details of auto-negotiation would be recognized by one of skill in the art in possession of the present disclosure, and thus are not described herein in detail.

The method 500 then proceeds to block 504 where the transmitter device transmits a contact resistance compensation data stream to the receiver device. In an embodiment, at block 504 and subsequent to performing the auto-negotiation operations at block 502, the transmitter device engine 402 and/or any of the transmitter subsystems 404-410 may operate to generate and transmit a contact resistance compensation data stream through the transmitter device connector interface connected to that transmitter subsystem, through the differential pair connected to that transmitter device connector interface, and through the receiver device connector interface coupled to that differential pair to the receiver device 300 (e.g., via one of its receiver subsystems 304-310.) In some embodiments, the contact resistance compensation data stream may be a predetermined data stream that has been configured to allow for the functionality discussed below, and one of skill in the art in possession of the present disclosure will recognize that a variety of data streams will allow for the contact resistance asymmetry determination and compensation discussed below while remaining within the scope of the present disclosure. For example, the contact resistance compensation data stream may include a sequence of bits that add up to the desired impedance (e.g., 001 is 1 ohm, 010 is 2 ohms, etc.).

In the examples below, the device 206 acts as the transmitter device 400 and operates to generate and transmit the contact resistance compensation data stream through the contact interface 206a (i.e., a transmitter device contact interface), through a positive differential pair trace in the differential trace pair 204b that provides a positive portion of the differential signal transmitted via the differential trace pair 204b, and through the contact interface 208a (i.e., a receiver device contact interface) to the device 208 that acts as the receiver device 300. Furthermore, the device 206 acting as the transmitter device 400 also operates to generate and transmit the contact resistance compensation data stream through the contact interface 206b (i.e., a transmitter device contact interface), through a negative differential pair trace in the differential trace pair 204b that provides a negative portion of the differential signal transmitted via the differential trace pair 204b, and through the contact interface 208b (i.e., a receiver device contact interface) to the device 208 that acts as the receiver device 300. However, one of skill in the art in possession of the present disclosure will recognize that other differential pairs (e.g., the differential trace pairs 204a, 204c, and 204d) may have contact resistance asymmetry compensated for in a manner similar to that discussed below while remaining within the scope of the present disclosure. Furthermore, as discussed above, in some embodiments the transmitter device 400 may provide functionality that is similar to that discussed below for the receiver device 300 while remaining within the scope of the present disclosure as well.

As discussed below, during the transmission of the contact resistance compensation data stream according to block 504, the receiver device 300 may operate to adjust an impedance provided by the receiver device to compensate for a contact resistance asymmetry in the receiver device connector interface, and then determine whether differential trace pair signal transmission capabilities for the differential trace pair (e.g., in transmitting the contact resistance compensation data stream) have improved in response to the transmitter-device-provided impedance adjustments. While a few specific examples of the adjustment of the receiver-device-provided impedance are discussed, one of skill in the art in possession of the present disclosure will recognize that adjustments of transmitter-device-provided impedance, as well as other techniques for compensating for the contact resistance impedance in a connector interface, will fall within the scope of the present disclosure as well.

For example, the method 500 may proceed to block 506 where the receiver device causes an increase in receiver-device-provided impedance for the contact resistance compensation data stream. In an embodiment, at block 506, the receiver device engine 302 and/or any of the receiver subsystems 304-310 may operate to cause an increase in the receiver-device-provided impedance while transmitting the contact resistance compensation data stream. For example, at block 506, the receiver device engine 302 and/or any of the receiver subsystems 304-310 may activate at least one impedance element in any receiver subsystem that connects to a differential pair through which the contact resistance compensation data stream is being received. In various embodiments, the at least one impedance element may regulate the receiver-device-provided impedance for the contact interface(s) (e.g., the receiver device contact interface and/or the transmitter device contact interface) for the positive differential pair trace, the contact interface(s) for the negative differential pair trace, and/or both.

With reference to the specific example illustrated in FIG. 3, the receiver device engine 302 and/or any of the receiver subsystems 304-310 may activate one or more of the programmable gates in the sets of programmable gates 304a-310a, respectively, in any receiver subsystem that connects to a differential pair through which the contact resistance compensation data stream is being transmitted. One of skill in the art in possession of the present disclosure will recognize that the activation of each programmable gate in a receiver subsystem will operate to increase the impedance being provided on one of the contact interfaces for one of the traces in the differential pair that is connected to that receiver subsystem and is transmitting the contact resistance compensation data stream. For example, activating a programmable gate in the set of programmable gates 304a may increase the receiver-device-provided impedance of the contact interface for the positive differential pair trace in the differential trace pair 204a. However, one of skill in the art in possession of the present disclosure will recognize that block 506 may be performed by activating a programmable gate in the set of programmable gates 304a to increase the receiver-device-provided impedance of the contact interface for the negative differential pair trace in the differential trace pair 204a, which will increase the receiver-device-provided impedance of the contact interface for the negative differential pair trace.

The method 500 then proceeds to decision block 508 where it is determined whether the differential trace pair signal transmission capabilities have increased. In an embodiment, at decision block 508, the receiver device engine 302 and/or any of the receiver subsystems 304-310 may operate to determine whether the differential trace pair signal transmission capabilities of any differential pair through which the contact resistance compensation data stream is being received have increased in response to the increased receiver-device-provided impedance. For example, at decision block 508, the receiver device engine 302 and/or any of the receiver subsystems 304-310 may analyze, before and after the increase in the receiver-device-provided impedance at block 506, an eye opening in an eye diagram that is generated at least in part using the contact resistance compensation data stream transmitted by the differential trace pair (e.g., the eye diagram may be generated for the differential trace pair group 204 based on the transmission of the contact resistance compensation data stream using the differential trace pair 204b, and the eye opening in the eye diagram may change after the increase in the receiver-device-provided impedance at block 506.) As would be understood by one of skill in the art in possession of the present disclosure, an increase in the size (e.g., area) of the eye opening in the eye diagram is indicative of increased differential trace pair signal transmission capabilities for the differential trace pair transmitting the contact resistance compensation data stream, while a decrease in the size (e.g., area) of the eye opening in the eye diagram is indicative of decreased differential trace pair signal transmission capabilities for the differential trace pair transmitting the contact resistance compensation data stream. However, one of skill in the art in possession of the present disclosure will recognize that other eye diagram analysis, and/or other differential trace pair signal transmission capability determination techniques may be utilized while remaining within the scope of the present disclosure as well.

If, at decision block 508, it is determined that the differential trace pair signal transmission capabilities have increased, the method 500 begins a loop through block 506 and decision block 508 in order to provide for increases in the receiver-device-provided impedance as long as those receiver-device-provided impedance increases provide differential trace pair signal transmission capabilities increases. As such, as the method 500 loops thought blocks 506 and 508, the receiver device engine 302 and/or any of the receiver subsystems 304-310 may provide for incremental increases (e.g., 0.1 ohm increases, 0.5 ohm increases, 1 ohm increases, 2 ohm increases, and/or any other incremental increase that would be apparent to one of skill in the art in possession of the present disclosure) in receiver-device-provided impedance for any contact resistance compensation data stream transmitted via a differential pair, and then determine whether the size (e.g., area) of the eye opening in the eye diagram has increased, and thus is indicative of increased differential trace pair signal transmission capabilities for that differential trace pair transmitting the contact resistance compensation data stream. As such, receiver-device-provided impedance may be increased until the size (e.g., area) of the eye opening in the eye diagram is no longer increasing, which is indicative that the differential trace pair signal transmission capabilities for that differential trace pair transmitting the contact resistance compensation data stream have been optimized for the contact resistance asymmetry present in the receiver device contact interface. As discussed below, when it is determined that the size of the eye opening in the eye diagram has not increased (or has decreased) in response to a receiver-device-provided impedance increase, the impedance element settings (e.g., number of activated/deactivated programmable gates in the receiver circuitry) utilized prior to that receiver-device-provided impedance increase may be identified as providing optimized differential trace pair signal transmission capabilities.

If, at decision block 508, it is determined that the differential trace pair signal transmission capabilities have not increased, the method 500 may proceed to block 510 where the receiver device causes a decrease in receiver-device-provided impedance for the contact resistance compensation data stream. In an embodiment, at block 510, the receiver device engine 302 and/or any of the receiver subsystems 304-310 may operate to cause a decrease in the receiver-device-provided impedance while transmitting the contact resistance compensation data stream. For example, at block 510, the receiver device engine 302 and/or any of the receiver subsystems 304-310 may deactivate at least one impedance element in any receiver subsystem that connects to a differential pair through which the contact resistance compensation data stream is being transmitted. In various embodiments, the at least one impedance element may regulate the receiver-device-provided impedance at the positive trace, the negative trace, and/or both.

With reference to the specific example illustrated in FIG. 3, the receiver device engine 302 and/or any of the receiver subsystems 304-310 may deactivate one or more of the programmable gates in each set of programmable gates 304a-310a, respectively, in any receiver subsystem that connects to a differential pair through which the contact resistance compensation data stream is being received. One of skill in the art in possession of the present disclosure will recognize that the deactivation of each programmable gate in a receiver subsystem will operate to decrease the impedance being provided by the receiver device on one of the contact interfaces of one of the traces in the differential pair that is connected to that receiver subsystem and is transmitting the contact resistance compensation data stream. For example, deactivating a programmable gate in the set of programmable gates 304a may decrease the receiver-device-provided impedance for the contact interface for the positive differential pair trace of the differential trace pair 204a. However, one of skill in the art in possession of the present disclosure will recognize that block 510 may be performed by deactivating a programmable gate in the set of programmable gates 304a to decrease the receiver-device-provided impedance of the contact interface for the negative differential pair trace in the differential trace pair 204a, which will decrease the receiver-device-provided impedance of the contact interface for the negative differential pair trace.

The method 500 then proceeds to decision block 512 where it is determined whether the differential trace pair signal transmission capabilities have increased. In an embodiment, at decision block 512, the receiver device engine 302 and/or any of the transmitter subsystems 404-410 may operate to determine whether the differential trace pair signal transmission capabilities of any differential pair through which the contact resistance compensation data stream is being transmitted have increased in response to the decreased receiver-device-provided impedance. For example, at decision block 512, the receiver device engine 302 and/or any of the receiver subsystems 304-310 may analyze, before and after the decrease in the receiver-device-provided impedance at block 506, an eye opening in an eye diagram that is generated at least in part using the contact resistance compensation data stream transmitted by the differential trace pair (e.g., the eye diagram may be generated for the differential trace pair group 204 based on the contact resistance compensation data stream transmitted using the differential trace pair 204b, and the eye opening in the eye diagram may change after the decrease in the receiver-device-provided impedance at block 508.) As discussed above, an increase in the size (e.g., area) of the eye opening in the eye diagram is indicative of increased differential trace pair signal transmission capabilities for the differential trace pair transmitting the contact resistance compensation data stream, while a decrease in the size (e.g., area) of the eye opening in the eye diagram is indicative of decreased differential trace pair signal transmission capabilities for the differential trace pair transmitting the contact resistance compensation data stream. However, one of skill in the art in possession of the present disclosure will recognize that other eye diagram analysis, and/or other differential trace pair signal transmission capability determination techniques may be utilized while remaining within the scope of the present disclosure as well.

If, at decision block 512, it is determined whether the differential trace pair signal transmission capabilities have increased, the method 500 begins a loop through block 510 and decision block 512 that provides for decreases in the receiver-device-provided impedance as long as those receiver-device-provided impedance decreases provide differential trace pair signal transmission capabilities increases. As such, as the method 500 loops thought blocks 510 and 512, the receiver device engine 302 and/or any of the receiver subsystems 304-310 may provide for incremental decreases (e.g., 0.1 ohm, 0.5 ohm, 1 ohm, 2 ohm, or any other incremental decrease that would be apparent to one of skill in the art in possession of the present disclosure) in receiver-device-provided impedance for any contact resistance compensation data stream transmitted via a differential pair, and then determine whether the size (e.g., area) of the eye opening in the eye diagram has increased, and thus is indicative of increased differential trace pair signal transmission capabilities for that differential trace pair transmitting the contact resistance compensation data stream. As such, receiver-device-provided impedance may be decreased until the size (e.g., area) of the eye opening in the eye diagram is no longer increasing, which is indicative that the differential trace pair signal transmission capabilities for that differential trace pair transmitting the contact resistance compensation data stream have been optimized for the contact resistance asymmetry present in the receiver device contact interface. As discussed below, when it is determined that the size of the eye opening in the eye diagram has not increased (or has decreased) in response to a receiver-device-provided impedance decrease, the impedance element settings (e.g., number of activated/deactivated programmable gates in the receiver circuitry) utilized prior to that receiver-device-provided impedance decrease may be identified as providing optimized differential trace pair signal transmission capabilities.

If, at decision block 512, it is determined that the differential trace pair signal transmission capabilities have not increased, the method 500 may proceed to block 514 where the receiver device sets the receiver-device-provided impedance. In an embodiment, at block 514, the receiver device 300 and/or any of the receiver subsystems 304-310 may set the impedance elements that were adjusted at blocks 506 and/or 510 in order to set the impedance provided by the receiver device 300. For example, the programmable gates in any receiver subsystem that were activated at block 506 or deactivated at block 510 before the differential pair signal transmission capabilities of the differential pair no longer increased (or decreased) may be set in that activated or deactivated state such that future signal transmission via those receiver subsystems will provide the impedance that provided for the increased/optimized differential pair signal transmission capabilities of its associated differential pair. As such, an offset in the impedance provided by the receiver device (e.g., impedance provided by impedance elements, programmable gates, drivers, etc.) may be set to compensate for an off-set that results from contact resistance asymmetry in a connector interface for the differential pair.

The method 500 then proceeds to block 516 where the transmitter device performs an adaptation process with the receiver device. In an embodiment, at block 516, the transmitter device 400 and/or any of the transmitter subsystems 404-410 may operate with the receiver device 300 and/or any of the receiver subsystems 304-310 to perform an adaptation process such as, for example, a back channel adaptation process. For example, the back channel adaptation process may utilize a Decision Feedback Equalization (DFE) component that performs decision feedback equalization operations that would be apparent to one of skill in the art in possession of the present disclosure.

Referring now to FIG. 6, a method 600 for compensating for contact resistance asymmetry associated with a differential pair is illustrated. The method 600 begins at block 602 where a transmitter device performs auto-negotiation operations with a receiver device. In an embodiment, at or prior to block 602, either or both of the devices 206 and 208 (e.g., a receiver device 300 and/or a transmitter device 400) may operate to identify a differential pair group. For example, the receiver device engine 302 and/or the receiver subsystems 304-310 in the receiver device 300, and/or the transmitter device engine 402 and/or the transmitter subsystems 404-410 in the transmitter device 400, may operate to identify serial lanes (e.g., each including a transmitter differential pair and a receiver differential pair) in a bus/link (e.g., a ×16 bus/link that provides 16 differential pairs numbered "0" through "15") that provides a differential pair group. With reference to FIG. 2, the differential trace pairs 204a-d in the differential trace pair group 204 may be identified. Following identification of the differential pair group, at block 602, the transmitter device 400 and the receiver device 300 may perform auto-negotiation operations associated with the differential trace pairs in the differential trace pair group 204 by, for example, sharing capabilities regarding transmission parameters, and selecting the highest performance transmission mode supported by both of the devices 300 and 400 to define common transmission parameters for use in signaling such as, for example, speed, duplex mode, flow control, and/or other transmission parameters that would be apparent to one of skill in the art in possession of the present disclosure. The details of auto-negotiation would be recognized by one of skill in the art in possession of the present disclosure, and thus are not described herein in detail.

The method 600 then proceeds to block 604 where the transmitter device transmits a contact resistance compensation data stream to the receiver device. In an embodiment, at block 604 and subsequent to performing the auto-negotiation operations at block 602, the transmitter device engine 402 and/or any of the transmitter subsystems 404-410 may operate to generate and transmit a contact resistance compensation data stream through the transmitter device connector interface connected to that transmitter subsystem, through the differential pair connected to that transmitter device connector interface, and through the receiver device connector interface coupled to that differential pair to the receiver device 300 (e.g., via one of its receiver subsystems 304-310.) In some embodiments, the contact resistance compensation data stream may be a predetermined data stream that has been configured to allow for the functionality discussed below, and one of skill in the art in possession of the present disclosure will recognize that a variety of data streams will allow for the contact resistance asymmetry determination and compensation discussed below while remaining within the scope of the present disclosure.

In the examples below, the device 206 acts as the transmitter device 400, and operates to generate and transmit the contact resistance compensation data stream through the contact interface 206a (i.e., a transmitter device contact interface), through a positive differential pair trace in the differential trace pair 204b that provides a positive portion of the differential signal transmitted via the differential trace pair 204b, and through the contact interface 208a (i.e., a receiver device contact interface) to the device 208 that acts as the receiver device 300. Furthermore, the device 206 acting as the transmitter device 400 also operates to generate and transmit the contact resistance compensation data stream through the contact interface 206b (i.e., a transmitter device contact interface), through a negative differential pair trace in the differential trace pair 204b that provides a negative portion of the differential signal transmitted via the differential trace pair 204b, and through the contact interface 208b (i.e., a receiver device contact interface) to the device 208 that acts as the receiver device 300. However, one of skill in the art in possession of the present disclosure will recognize that other differential pairs (e.g., the differential trace pairs 204a, 204c, and 204d) may have contact resistance asymmetry compensated for in a manner similar to that discussed below while remaining within the scope of the present disclosure.

As discussed below, during the transmission of the contact resistance compensation data stream according to block 604, the receiver device 300 may operate to adjust an impedance provided by the receiver device to compensate for a contact resistance asymmetry in the receiver device connector interface and/or the transmitter device interface. While a few specific examples of the adjustment of the receiver-device-provided impedance are discussed, one of skill in the art in possession of the present disclosure will recognize that adjustments of transmitter-device-provided impedance, as well as other techniques for compensating for the contact resistance impedance in a connector interface, will fall within the scope of the present disclosure as well.

The method 600 may proceed to block 606 where the receiver device determines the contact resistance asymmetry from the contact resistance compensation stream. In an embodiment, at block 606, the receiver device engine 302 and/or any of the receiver subsystems 304-310 may determine the contact resistance asymmetry at the contact interfaces (e.g., contact interfaces 206a, 206b, 208a, and 208b) of the differential trace pair 204b. For example, the receiver device engine 302 and/or any of the receiver subsystems 304-310 may determine a resistance for the negative differential signal and a resistance for the positive differential signal, and then determine a difference/offset between those two resistances. In a specific example, the receiver device engine 302 and/or any of the receiver subsystems 304-310 may perform die-to-die time domain reflectometer (TDR) operations, as described in U.S. Pat. No. 9,785,607, filed Nov. 10, 2014, the disclosure of which is incorporated by reference herein in its entirety. Using the die-to-die TDR operations, a time domain representation of an impedance of each of the positive portion and the negative portion of the differential pair is determined. Once a profile of the time domain representation of the impedance of each of the positive portion and the negative portion of the differential pair is determined, the delta or difference between the profiles may indicate if receiver-device-provided impedance needs to be adjusted, in which direction such receiver-device-provided impedance needs to be adjusted, and by how much receiver-device-provided impedance needs to be adjusted.

Figure 7:
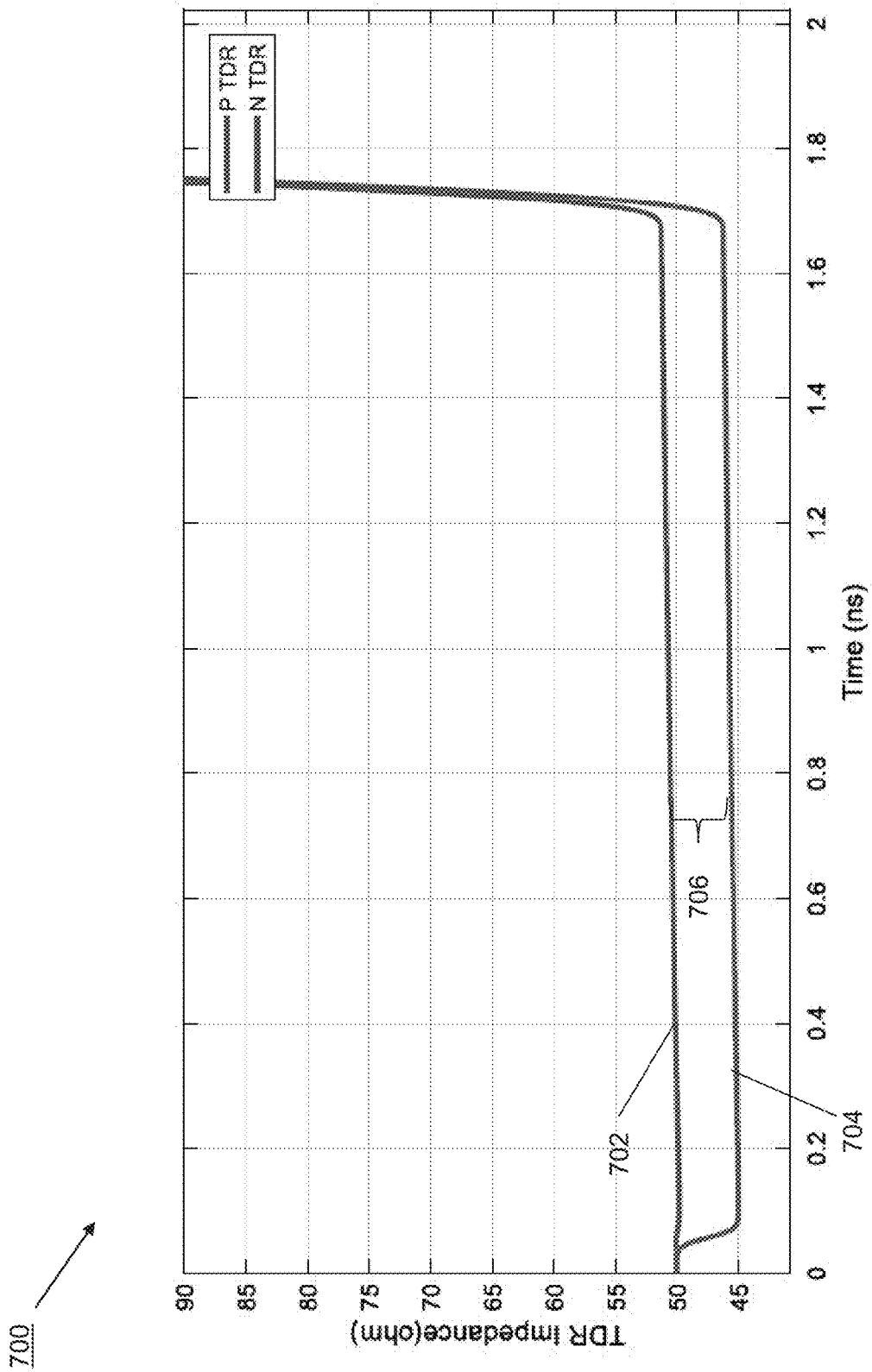
FIG. 7 is a time-domain reflectometer (TDR) diagram illustrating an embodiment of time-domain impedance determined on a positive contact and a negative contact to a differential trace pair.

With reference to FIG. 7, a TDR diagram 700 illustrates an embodiment of a TDR profile 702 of the time domain representation of the impedance of a positive portion of a differential pair, and a TDR profile 704 of the time domain representation of the impedance of a negative portion of the differential pair. As illustrated, the TDR profile 702 and the TDR profile 704 indicate that the differential pair is experiencing a contact resistance asymmetry having an offset 706 that may be due to the contact resistance in contact interfaces for the differential pair that is transmitting a positive signal and a negative signal. As illustrated, the offset 706 indicates that the positive differential pair trace and its contact interfaces are experiencing approximately 5 ohms more resistance than the negative differential pair trace and its contact interfaces when the contact resistance compensation stream is provided on each of the positive portion and the negative portion of the differential pair.

The method 600 may then proceed to block 608 where the receiver device adjusts the receiver-device-provided impedance based on the contact resistance asymmetry determined in block 606. In an embodiment, at block 608, the receiver device engine 302 and/or any of the receiver subsystems 304-310 may adjust the receiver-device-provided impedance for the contact resistance compensation data stream based on the contact resistance asymmetry. For example, the receiver device engine 302 and/or any of the receiver subsystems 304-310 may activate at least one impedance element in any receiver subsystem that connects to a differential pair through which the contact resistance compensation data stream is being transmitted (or was being transmitted.) In various embodiments, the at least one impedance element may regulate the receiver-device-provided impedance at the connector interface of the positive differential pair trace, at the connector interface of the negative differential pair trace, and/or both. With reference to the specific example illustrated in FIG. 3, the receiver device engine 302 and/or any of the receiver subsystems 304-310 may activate or deactivate one or more of the programmable gates in each set of programmable gates 304a-310a, respectively, in any receiver subsystem that connects to a differential pair through which the contact resistance compensation data stream is being/was transmitted, and one of skill in the art in possession of the present disclosure will recognize that the activation of each programmable gate in a receiver subsystem will operate to increase the impedance for one of the contact interfaces included in the differential pair for that receiver subsystem, while the deactivation of each programmable gate in a receiver subsystem will operate to decrease the impedance for one of the contact interfaces in the differential pair for that receiver subsystem. For example, activating a programmable gate in the set of programmable gates 304a may increase the receiver-device-provided impedance for the positive portion of the differential trace pair 204a, while deactivating the programmable gate in the set of programmable gates 304a (if already activated) may decrease the receiver-device-provided impedance for the positive portion of the differential trace pair 204a. Likewise, activating a programmable gate 304a may increase the receiver-device-provided impedance for the negative portion of the differential trace pair 204a, while deactivating the programmable gate 304a (if already activated) may decrease the receiver-device-provided impedance for the negative portion of the differential trace pair 204a.

Using the contact resistance asymmetry that was determined by the time domain representation of impedance for each of the positive portion and the negative portion of the differential pair, the receiver device engine 302 and/or any of the receiver subsystems 304-310 may determine the difference between the time domain representation of impedance for each of the positive portion and the negative portion of the differential pair, which may indicate a direction to increase/decrease a receiver-device-provided impedance, as well as how much receiver-device-provided impedance should be added or removed. For example, and with reference to FIG. 7, the receiver device engine 302 and/or any of the receiver subsystems 304-310 may activate one or more programmable gates to increase the receiver-device-provided impedance for the negative portion of the differential pair by the offset 706 (e.g., 5 ohms) in order to substantially match the impedance provided by the positive portion of the differential pair. In some embodiments, the number of programmable gates to activate at block 608 may depend on the increments of the programmable gates (e.g., 0.1 ohm, 0.5 ohm, 1 ohm, 2 ohms, and/or any other increment that would be apparent to one of skill in the art). In some examples, different programmable gates may have different resistances (e.g., a first programmable gate may have 1 ohm resistance when activated, while a second programmable gate may have 5 ohms of resistance when activated) and, as such, the receiver device engine 302 and/or any of the receiver subsystems 304-310 may activate the appropriate programmable gates to increase the receiver-device-provided impedance for the negative portion of the differential pair such that the offset 706 is reduced to 0 ohms, or is within a predefined tolerance of 0 ohms such that the offset 706 is substantially 0 ohms. In other examples, the receiver device engine 302 and/or any of the receiver subsystems 304-310 may deactivate the appropriate programmable gates to decrease the receiver-device-provided impedance for the positive portion of the differential pair such that the offset 706 is reduced to 0 ohms, or within a predefined tolerance of 0 ohms such that the offset 706 is substantially 0 ohms. In yet other examples, the receiver device engine 302 and/or any of the receiver subsystems 304-310 may deactivate the appropriate programmable gates to decrease the receiver-device-provided impedance for the positive portion or the differential pair, and activate the appropriate programmable gates to increase the receiver-device-provided impedance for the negative portion of the differential pair, such that the offset 706 is reduced to 0 ohms or within a predefined tolerance of 0 ohms such that the offset 706 is substantially 0 ohms.

The method 600 may proceed to block 610 where the receiver device sets the receiver-device-provided impedance. In an embodiment, at block 610, the receiver device 300 and/or any of the receiver subsystems 304-310 may set the impedance elements that were adjusted at block 608 in order to set the impedance provided by the receiver device 300. For example, the programmable gates in any receiver subsystem that were activated and/or deactivated at block 608 may be set in that activated and/or deactivated state such that future signal transmission via those receiver subsystems will provide the impedance that provides for increased/ optimized differential pair signal transmission capabilities of its associated differential pair via the compensation of the contact resistance asymmetry. As such, an off-set in the impedance provided by the receiver device (e.g., impedance provided by impedance elements, programmable gates, drivers, etc.) may be set to compensate for an off-set that results from contact resistance asymmetry in a connector interface for the differential pair.

The method 600 then proceeds to block 612 where the transmitter device performs an adaptation process with the receiver device. In an embodiment, at block 612, the transmitter device 400 and/or any of the transmitter subsystems 404-410 with the receiver device 300 and/or any of the receiver subsystems 304-310 may operate to perform an adaptation process such as, for example, a back channel adaptation process. For example, the back channel adaptation process may utilize a Decision Feedback Equalization (DFE) component that performs decision feedback equalization operations that would be apparent to one of skill in the art in possession of the present disclosure.

Figure 8A:
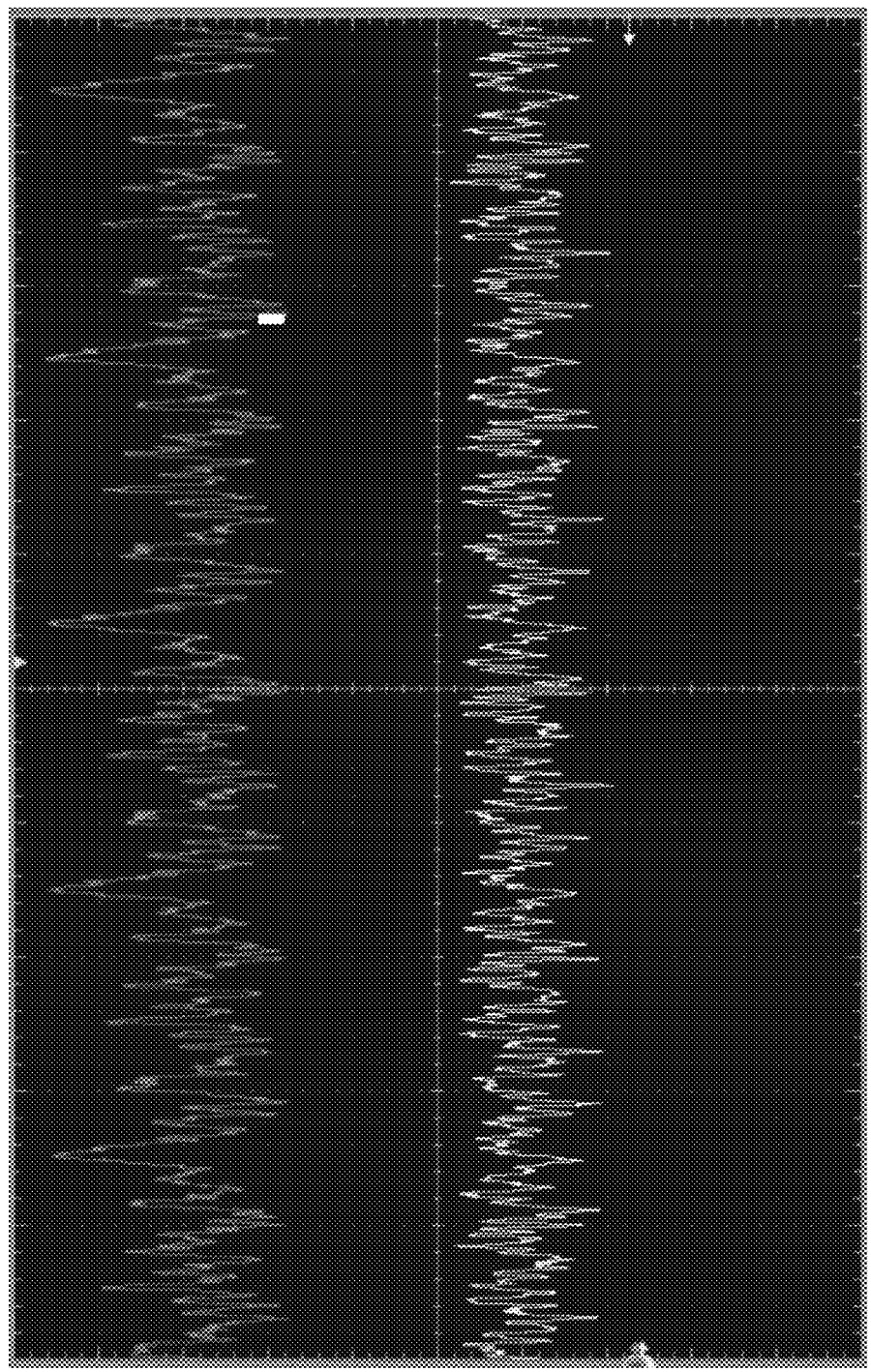
FIG. 8A is a signal diagram illustrating an embodiment of a single-ended signal measurement for a differential trace pair experiencing a contact resistance asymmetry.
Figure 8B:
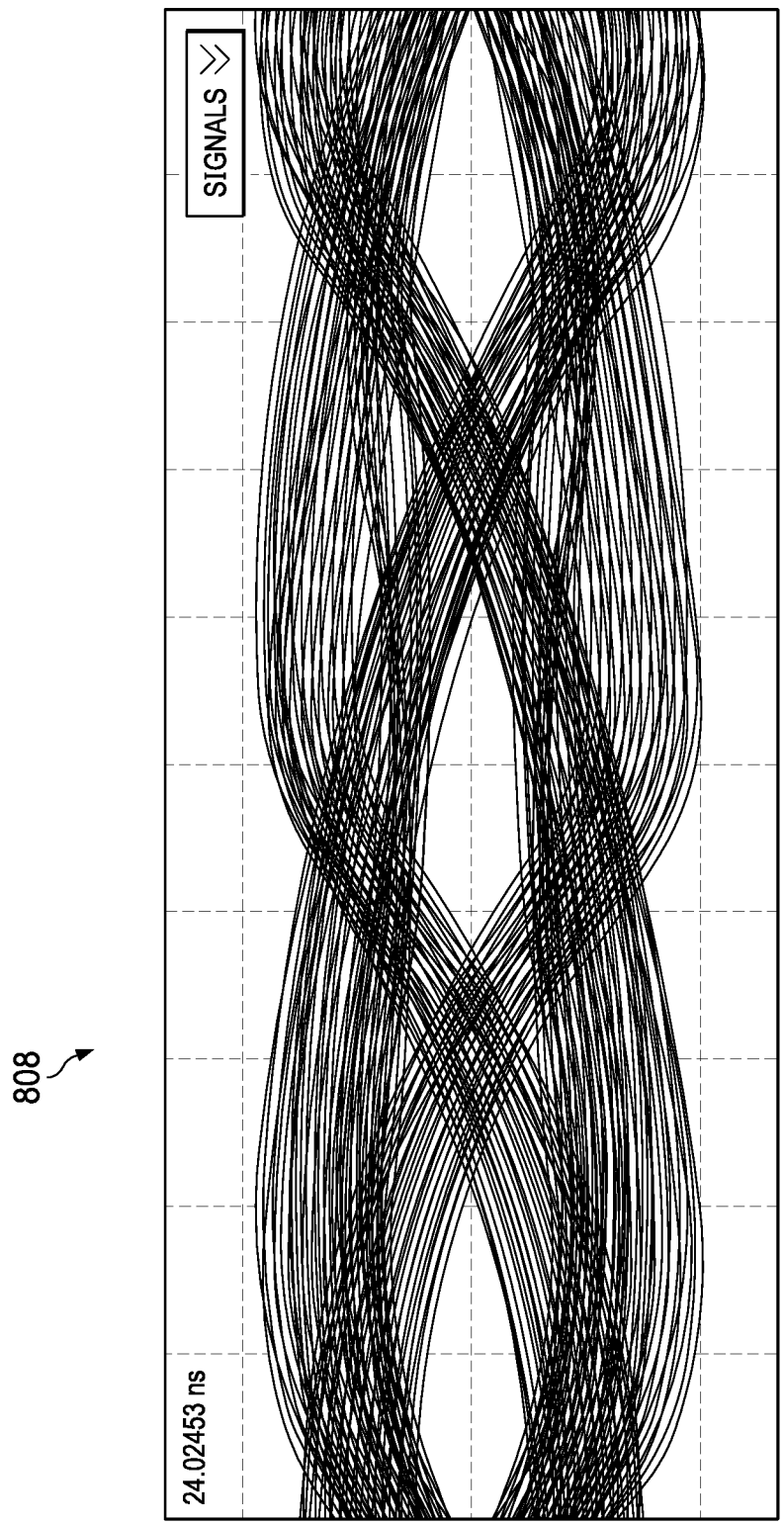
FIG. 8B is an eye diagram illustrating an embodiment of results of the differential trace pair experiencing the contact resistance asymmetry.
Figure 9A:
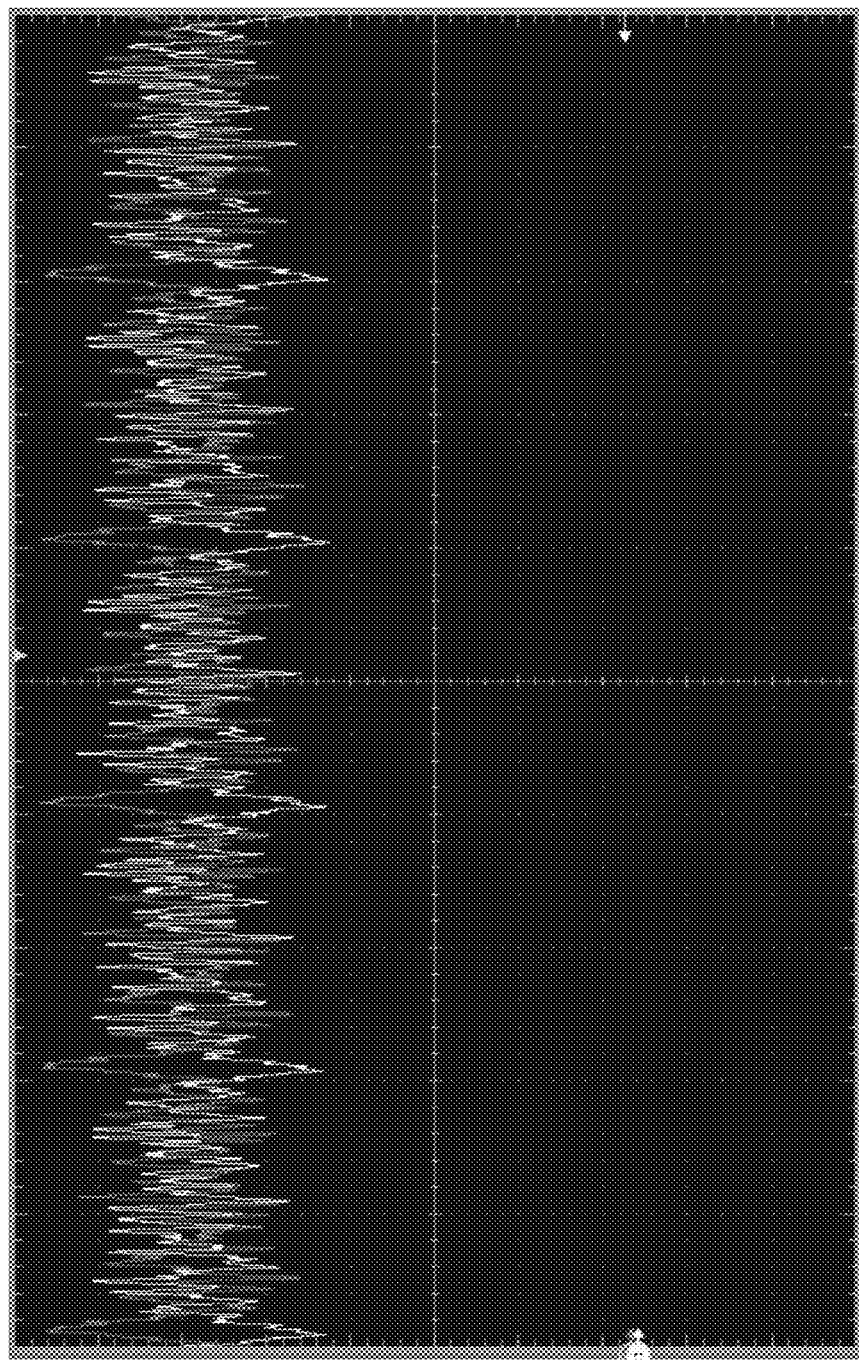
FIG. 9A is a signal diagram illustrating an embodiment of a single-ended signal measurement for a differential trace pair for which the contact resistance asymmetry illustrated in FIG. 8A has been compensated.
Figure 9B:
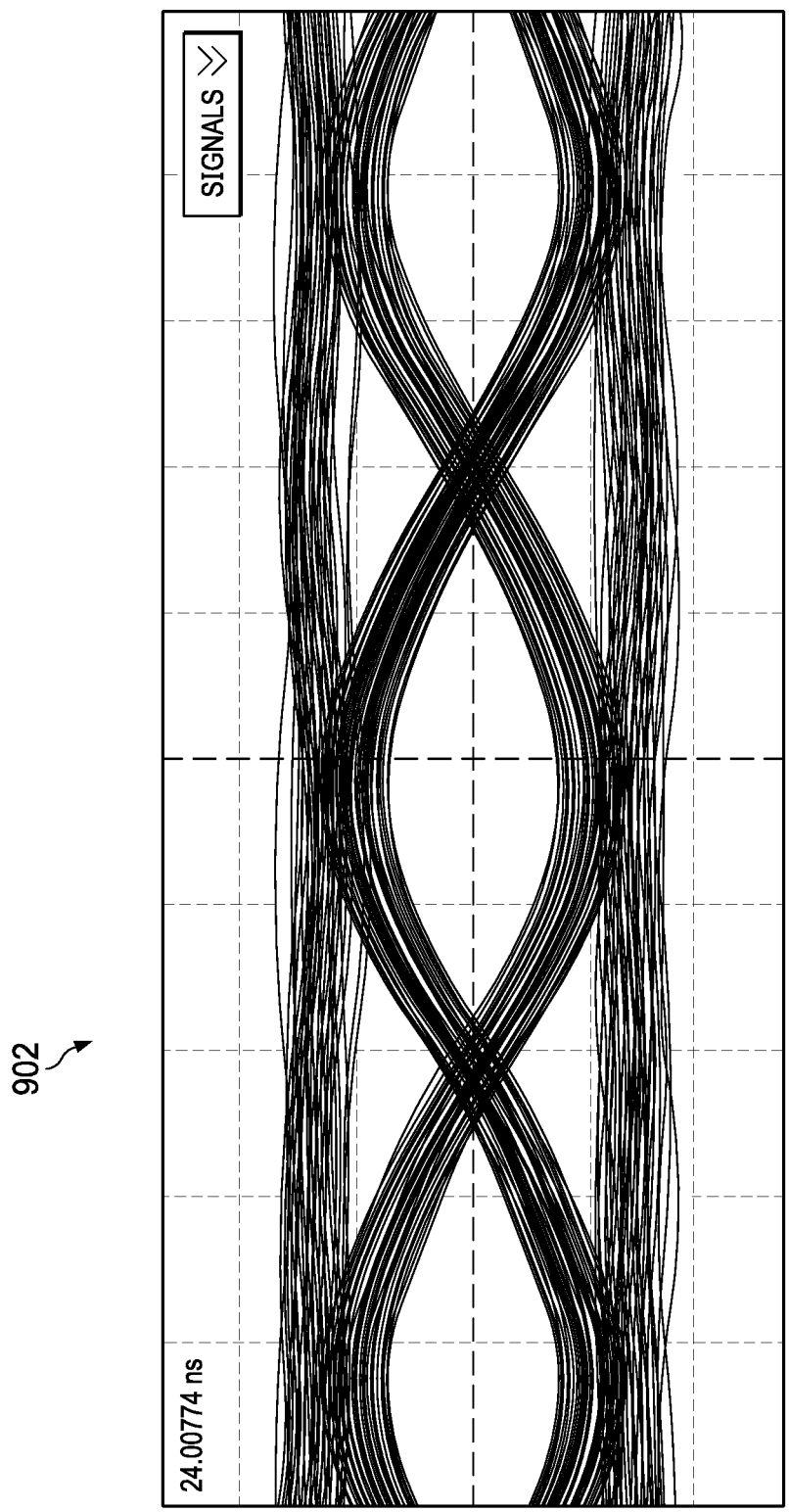
FIG. 9B is an eye diagram illustrating an embodiment of the results of the compensation of the contact resistance asymmetry for the differential trace pair illustrated in FIG. 8B.

A few specific examples of the adjustments of receiver-device-provided impedance, as described in methods 500 and 600, and the associated increases/optimization of differential pair signal transmission capabilities, will now be provided. With reference to FIG. 8A, a signal diagram 800 illustrates an embodiment of a single-ended signal measurement for a differential pair experiencing a contact resistance asymmetry, with a positive signal component 802 and a negative signal component 804 having an offset 806 due to the contact resistance in contact interfaces for the differential pair that is transmitting that positive signal component 802 and negative signal component 804. FIG. 8B illustrates an eye diagram 808 for the signal having the signal components 802 and 804 with the offset 806, and one of skill in the art in possession of the present disclosure will recognize that the eye opening in the eye diagram 808 is indicative of undesirable differential pair signal transmission capabilities. At block 506 or 510 of the method 500, or at block 610 of the method 600, the adjustment of the receiver-device-provided impedance may remedy the issues illustrated in the signal diagram 800, as illustrated by the signal diagram 900 of FIG. 9A that includes a single-ended signal measurement for the differential pair for which the contact resistance asymmetry illustrated in FIG. 8A has been compensated, with the positive signal component 802 and the negative signal component 804 no longer experiencing the offset 806 due to the contact resistance asymmetry compensation that provides the off-set in the impedance provided by the transmitter device in order to compensate for the offset 806. FIG. 9B illustrates an eye diagram 902 for the signal having the signal components 802 and 804 without the offset 806, and one of skill in the art in possession of the present disclosure will recognize that the eye opening in the eye diagram 902 is indicative of desirable differential pair signal transmission capabilities (particularly relative to the eye diagram 808).

Figure 10A:
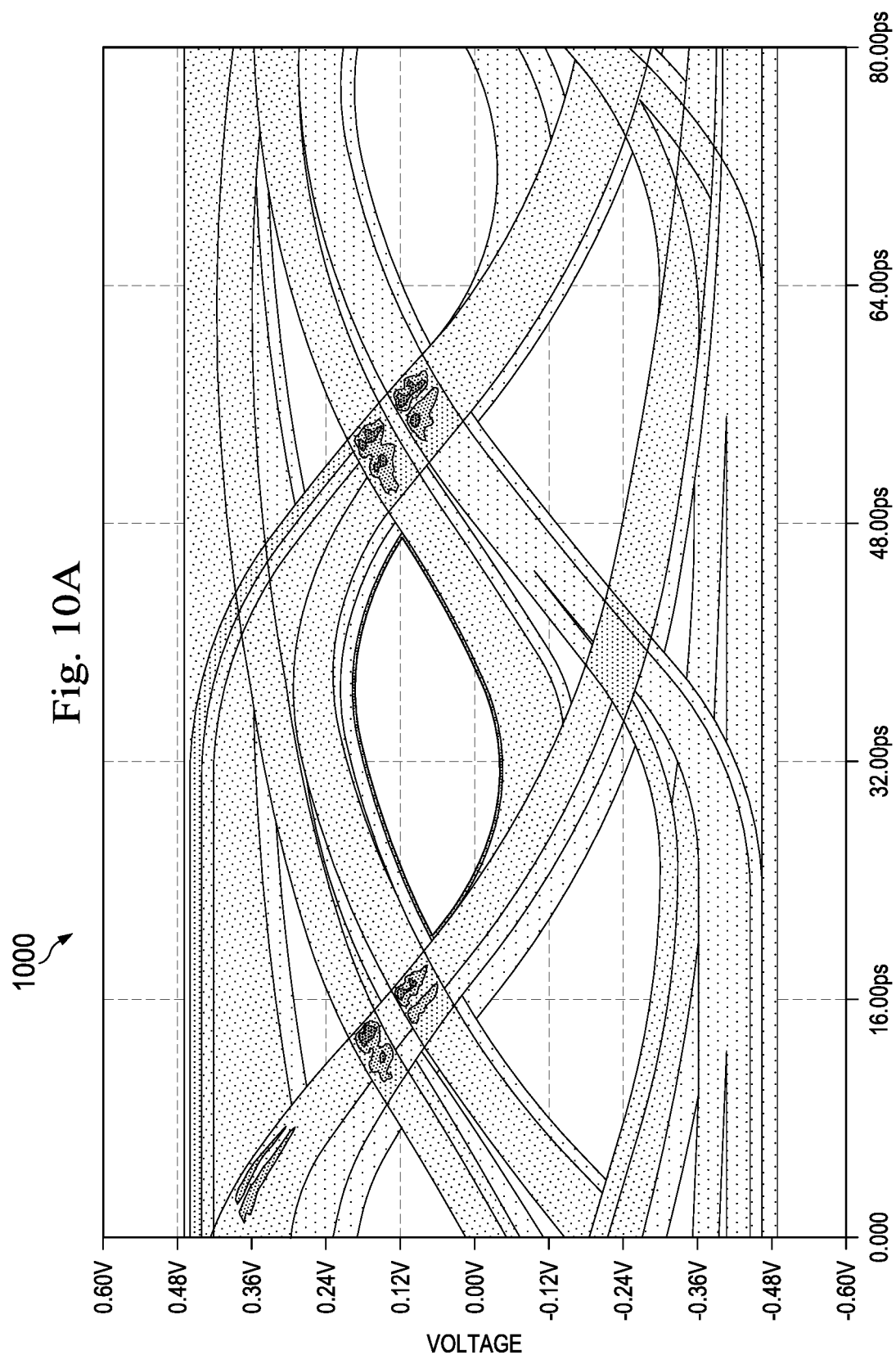
FIG. 10A is an eye diagram illustrating an embodiment of the results of a differential trace pair experiencing contact resistance asymmetry.

Furthermore, FIG. 10A illustrates an experimental embodiment of the present disclosure that provided an eye diagram 1000 for differential pairs that were experiencing contact resistance asymmetry, and FIG. 10B illustrates an eye diagram 1002 for those differential pairs once the contact resistance asymmetry had been compensated for using the teachings of the present disclosure. One of skill in the art in possession of the present disclosure will recognize that the eye opening in the eye diagram 1002 is indicative of an increase/optimization of the differential pair signal transmission capabilities of the differential pairs relative to the eye opening in the eye diagram 1000.

Thus, systems and methods have been described that compensate for contact resistance asymmetry that exists in a connector interface that connects a device to a differential pair, which allows for an increase/optimization of the differential pair signal transmission capabilities of the differential pair with respect to that contact resistance asymmetry. For example, a receiver device of the present disclosure may operate to adjust an impedance provided by its receiver circuitry by activating or deactivating programmable gates to increase or decrease impedance, respectively, provided by the receiver device, and then determine whether an eye opening in eye diagram (which is generated at least in part using a data stream transmitted by the differential trace pair) has increased in response to the adjustment of the impedance provided by the receiver device. In other examples, a receiver device of the present disclosure may operate to determine the contact resistance asymmetry between the positive portion of the differential pair and the negative portion of the differential pair, and adjust an impedance provided by its receiver circuitry by activating or deactivating programmable gates to increase or decrease impedance, respectively, provided by the receiver device according to the difference in impedance between the negative portion and the positive portion of the differential pair. As such, the signal transmission capabilities of the differential pair may be optimized with respect to the contact resistance asymmetry that exists in at least one of its connector interfaces, reducing or even eliminating the impact of contact resistance variations that will cause significant degradations in signal integrity for signals transmitted at next generation signal transmission speeds.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A differential pair contact resistance asymmetry compensation system, comprising:
 a board;
 a differential trace pair that is provided on the board;
 a transmitter device that is coupled to the differential trace pair via a transmitter device connector interface; and
 a receiver device that is coupled to the differential trace pair via a receiver device connector interface, wherein the receiver device is configured to:
  receive, from the transmitter device via the differential trace pair, a contact resistance compensation data stream;
  adjust an impedance provided by the receiver device to compensate for a contact resistance asymmetry in at least the receiver device connector interface; and
  set the impedance provided by the receiver device.

2. The system of claim 1, wherein the receiver device is configured to:
 determine, using the contact resistance compensation data stream, the contact resistance asymmetry in at least the receiver device connector interface, wherein the adjusting the impedance provided by the receiver device to compensate for the contact resistance asymmetry in the receiver device connector interface is based on the contact resistance asymmetry.

3. The system of claim 1, wherein the receiver device is configured to:
 perform, prior to receiving the contact resistance compensation data stream and adjusting the impedance provided by the receiver device, auto-negotiation operations associated with the differential trace pair.

4. The system of claim 1, wherein the receiver device is configured to:
 determine that differential trace pair signal transmission capabilities for the differential trace pair in transmitting the contact resistance compensation data stream have improved in response to the adjustment of the impedance provided by the receiver device and, in response, set the impedance provided by the receiver device.

5. The system of claim 4, wherein the receiver device is configured to adjust the impedance provided by the receiver device, and determine that the differential trace pair signal transmission capabilities for the differential trace pair have improved, by:
 activating at least one impedance element in the receiver device to increase the impedance provided by the receiver device; and
 determine, in response to activating the at least one impedance element, that the differential trace pair signal transmission capabilities for the differential trace pair have improved.

6. The system of claim 4, wherein the receiver device is configured to adjust the impedance provided by the receiver device, and determine that the differential trace pair signal transmission capabilities for the differential trace pair have improved, by:
  deactivating at least one impedance element in the receiver device to decrease the impedance provided by the receiver device; and
  determining, in response to deactivating the at least one impedance element, that the differential trace pair signal transmission capabilities for the differential trace pair have improved.

7. The system of claim 4, wherein the determining that the differential trace pair signal transmission capabilities for the differential trace pair have improved include:
  determining that an eye opening in an eye diagram, which is generated at least in part using the contact resistance compensation data stream transmitted by the differential trace pair, has increased in response to the adjustment of the impedance provided by the receiver device.

8. An Information Handling System (IHS), comprising:
  a processing system; and
  a memory system that is coupled to the processing system and that includes instructions that, when executed by the processing system, cause the processing system to provide a contact resistance asymmetry compensation engine that is configured to:
    receive, from a transmitter device via a connector interface and a differential pair, a contact resistance compensation data stream;
    adjust an impedance provided by receiver circuitry used to receive the contact resistance compensation data stream in order to compensate for a contact resistance asymmetry in at least the connector interface; and
    set the impedance provided by the receiver circuitry.

9. The IHS of claim 8, wherein the contact resistance asymmetry compensation engine is configured to:
  determine, using the contact resistance compensation data stream, the contact resistance asymmetry in at least the connector interface, wherein the adjusting the impedance provided by the receiver circuitry used to receive the contact resistance compensation data stream in order to compensate for the contact resistance asymmetry in the connector interface is based on the contact resistance asymmetry.

10. The IHS of claim 8, wherein the contact resistance asymmetry compensation engine is configured to:
  perform, prior to receiving the contact resistance compensation data stream and adjusting the impedance provided by the receiver circuitry, auto-negotiation operations associated with the differential pair.

11. The IHS of claim 8, wherein the contact resistance asymmetry compensation engine is configured to:
  determine that differential pair signal transmission capabilities for the differential pair in transmitting the contact resistance compensation data stream have improved in response to the adjustment of the impedance provided by the receiver circuitry and, in response, set the impedance provided by the receiver circuitry.

12. The IHS of claim 11, wherein the contact resistance asymmetry compensation engine is configured to adjust the impedance provided by the receiver circuitry, and determine that the differential pair signal transmission capabilities for the differential pair have improved, by:
  activating at least one impedance element in the receiver circuitry to increase the impedance provided by the receiver circuitry; and
  determine, in response to activating the at least one impedance element, that the differential pair signal transmission capabilities for the differential pair have improved.

13. The IHS of claim 11, wherein the contact resistance asymmetry compensation engine is configured to adjust the impedance provided by the receiver circuitry, and determine that the differential pair signal transmission capabilities for the differential pair have improved, by:
  deactivating at least one impedance element in the receiver circuitry to decrease the impedance provided by the receiver circuitry; and
  determining, in response to deactivating the at least one impedance element, that the differential pair signal transmission capabilities for the differential pair have improved.

14. The IHS of claim 11, wherein the determining that the differential pair signal transmission capabilities for the differential pair have improved include:
  determining that an eye opening in an eye diagram, which is generated at least in part using the contact resistance compensation data stream transmitted by the differential pair, has increased in response to the adjustment of the impedance provided by the receiver circuitry.

15. A method for compensating for contact resistance asymmetry in a differential pair, comprising:
  receiving, by a receiver device from a transmitter device via the differential pair, a contact resistance compensation data stream;
  adjusting, by the receiver device, an impedance provided by the receiver device to compensate for contact resistance asymmetry in at least a receiver device connector interface; and
  setting, by the receiver device, the impedance provided by the receiver device.

16. The method of claim 15, further comprising:
  determining, by the receiver device using the contact resistance compensation data stream, the contact resistance asymmetry in at least the receiver device connector interface, wherein the adjusting the impedance provided by the receiver device to compensate for the contact resistance asymmetry in the receiver device connector interface is based on the contact resistance asymmetry determined.

17. The method of claim 15, further comprising:
  performing, by the receiver device prior to receiving the contact resistance compensation data stream and adjusting the impedance provided by the receiver device, auto-negotiation operations associated with the differential pair.

18. The method of claim 15, further comprising:
  determining, by the receiver device, that differential pair signal transmission capabilities for the differential pair in transmitting the contact resistance compensation data stream have improved in response to the adjustment of the impedance provided by the receiver device and, in response, setting the impedance provided by the receiver device.

19. The method of claim 18, wherein the adjusting the impedance provided by the receiver device, and the determining that the differential pair signal transmission capabilities for the differential pair have improved, by:
  activating, by the receiver device, at least one impedance element in the receiver device to increase the impedance provided by the receiver device; and
  determining, by the receiver device in response to activating the at least one impedance element, that the differential pair signal transmission capabilities for the differential pair have improved.

20. The method of claim 18, wherein the adjusting the impedance provided by the receiver device, and the determining that the differential pair signal transmission capabilities for the differential pair have improved, by:

deactivating, by the receiver device, at least one impedance element in the receiver device to decrease the impedance provided by the receiver device; and determining, by the receiver device in response to deactivating the at least one impedance element, that the differential pair signal transmission capabilities for the differential pair have improved.

* * * * *